United States Patent
Lin et al.

(10) Patent No.: US 8,786,093 B2
(45) Date of Patent: Jul. 22, 2014

(54) CHIP PACKAGE AND METHOD FOR FORMING THE SAME

(76) Inventors: Chia-Sheng Lin, Zhongli (TW); Tzu-Hsiang Hung, Kaohsiung (TW)

(*) Notice: Subject to any disclaimer, the term of this patent is extended or adjusted under 35 U.S.C. 154(b) by 164 days.

(21) Appl. No.: 13/359,452

(22) Filed: Jan. 26, 2012

(65) Prior Publication Data
US 2012/0193786 A1    Aug. 2, 2012

Related U.S. Application Data
(60) Provisional application No. 61/436,762, filed on Jan. 27, 2011.

(51) Int. Cl.
| | | |
|---|---|---|
| *H01L 23/48* | (2006.01) | |
| *H01L 21/44* | (2006.01) | |
| *H01L 23/60* | (2006.01) | |
| *H01L 23/522* | (2006.01) | |
| *H01L 23/31* | (2006.01) | |
| *H01L 23/00* | (2006.01) | |
| *H01L 21/768* | (2006.01) | |

(52) U.S. Cl.
CPC . *H01L 21/76898* (2013.01); *H01L 2224/05548* (2013.01); *H01L 23/60* (2013.01); *H01L 23/522* (2013.01); *H01L 23/3157* (2013.01); *H01L 2224/02372* (2013.01); *H01L 24/05* (2013.01); *H01L 24/13* (2013.01); *H01L 2224/0401* (2013.01); *H01L 2224/05567* (2013.01); *H01L 2224/13022* (2013.01); *H01L 2224/02375* (2013.01); *H01L 2224/13024* (2013.01); *H01L 23/481* (2013.01); *H01L 2224/02377* (2013.01)

USPC .......... 257/773; 257/786; 257/659; 257/660; 257/E23.145; 438/666; 438/612; 438/618

(58) Field of Classification Search
CPC ... H01L 24/10; H01L 23/552; H01L 23/3114; H01L 2924/14
USPC .................... 257/659, 660, 773, 786, E23.02; 438/612, 618, 666
See application file for complete search history.

(56) References Cited

U.S. PATENT DOCUMENTS

| 7,666,711 | B2 * | 2/2010 | Pagaila et al. | ................. 438/114 |
| 7,851,894 | B1 * | 12/2010 | Scanlan | ....................... 257/659 |
| 8,399,963 | B2 * | 3/2013 | Tsai et al. | ..................... 257/620 |
| 8,456,856 | B2 * | 6/2013 | Lin et al. | ...................... 361/783 |
| 8,492,196 | B2 * | 7/2013 | Pagaila et al. | ................. 438/106 |

(Continued)

FOREIGN PATENT DOCUMENTS
CN         102034796         4/2011

*Primary Examiner* — Nitin Parekh
(74) *Attorney, Agent, or Firm* — Liu & Liu

(57) ABSTRACT

An embodiment of the invention provides a chip package which includes: a substrate; a device region disposed in or on the substrate; a signal pad disposed in or on the substrate and electrically connected to the device region; a ground pad disposed in or on the substrate; a signal bump disposed on a surface of the substrate, wherein the signal bump is electrically connected to the signal pad through a signal conducting layer; a ground conducting layer disposed on the surface of the substrate and electrically connected to the ground pad; and a protection layer disposed on the surface of the substrate, wherein the protection layer completely covers the entire side terminals of the signal conducting layer and partially covers the ground conducting layer such that a side terminal of the ground conducting layer is exposed on a side of the substrate.

20 Claims, 7 Drawing Sheets

(56) References Cited

U.S. PATENT DOCUMENTS

| | | | |
|---|---|---|---|
| 8,519,552 B2* | 8/2013 | Lin et al. ................. 257/786 |
| 2006/0264041 A1* | 11/2006 | Rigg et al. ................ 438/667 |
| 2008/0073752 A1* | 3/2008 | Asai et al. ................ 257/615 |
| 2009/0283877 A1 | 11/2009 | Tsai et al. |
| 2010/0006988 A1* | 1/2010 | Tang et al. ................ 257/659 |
| 2010/0187697 A1 | 7/2010 | Tsai et al. |
| 2011/0298109 A1* | 12/2011 | Pagaila et al. ............. 257/660 |

* cited by examiner

CHIP PACKAGE AND METHOD FOR FORMING THE SAME

CROSS REFERENCE TO RELATED APPLICATIONS

This Application claims the benefit of U.S. Provisional Application No. 61/436,762, filed on Jan. 27, 2011, the entirety of which is incorporated by reference herein.

BACKGROUND OF THE INVENTION

1. Field of the Invention

The invention relates to a chip package, and in particular relates to a chip package having a shielding structure to prevent electromagnetic interference (EMI) and a fabrication method thereof.

2. Description of the Related Art

As sizes of chip packages continue to become thinner and lighter and signal transmission speed continues to increase, electromagnetic interference (EMI) and electrostatic discharge (ESD) problems for chip packages have worsened. Because sizes of chip packages continue to get smaller, design of ground wiring in chip packages have become more important.

BRIEF SUMMARY OF THE INVENTION

An embodiment of the invention provides a chip package which includes: a substrate; a device region disposed in or on the substrate; a signal pad disposed in or on the substrate and electrically connected to the device region; a ground pad disposed in or on the substrate; a signal bump disposed on a surface of the substrate, wherein the signal bump is electrically connected to the signal pad through a signal conducting layer; a ground conducting layer disposed on the surface of the substrate and electrically connected to the ground pad; and a protection layer disposed on the surface of the substrate, wherein the protection layer completely covers the entire side edges of the signal conducting layer and partially covers the ground conducting layer such that a side edge of the ground conducting layer is exposed at a side of the substrate.

An embodiment of the invention provides a method for forming a chip package which includes: providing a substrate, wherein a device region, a signal pad, and a ground pad are respectively disposed in or on the substrate, and the signal pad is electrically connected to the device region; forming a signal conducting layer and a ground conducting layer on a surface of the substrate, wherein the signal conducting layer is electrically connected to the signal pad; forming a protection layer on the surface of the substrate, wherein the protection layer has at least an opening exposing a portion of the signal conducting layer and completely covers the entire side edges of the signal conducting layer, wherein a side edge of the ground conducting layer is exposed; forming a signal bump on the opening of the protection layer, wherein the signal bump is electrically connected to the signal pad through the signal conducting layer; and dicing the substrate to form at least one chip package, wherein the side edge of the ground conducting layer is exposed at a side of the substrate after the substrate is diced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
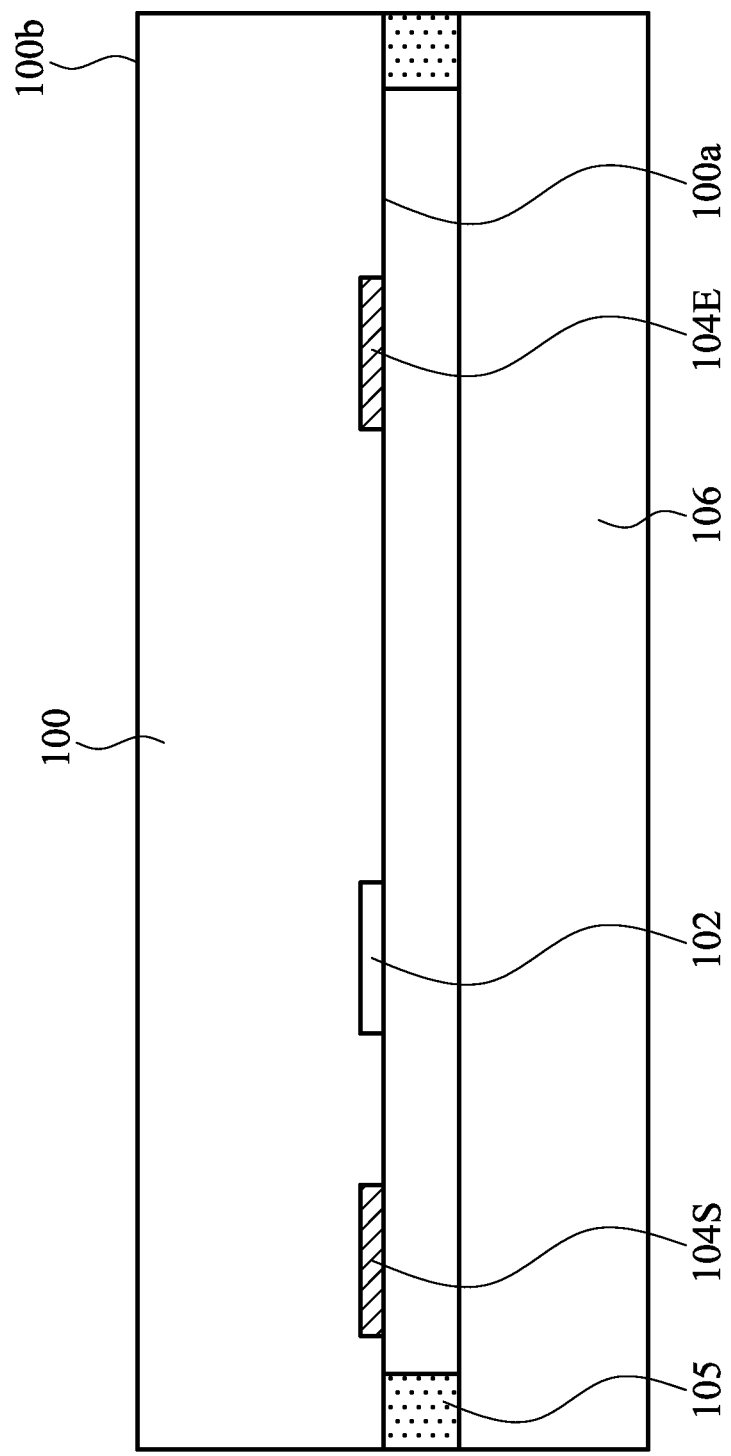
FIGS. 1A-1E are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package an image sensor chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Before embodiments of the invention are illustrated, a chip package known by the inventor of the application is first illustrated. In the chip package, ground conducting structures are merely disposed on four corners of the substrate of the chip package. Thus, all of the ground conducting wires need to be led to at least one of the corners to lead out the electrostatic discharge current generated during the fabrication or use of the chip package. Thus, many conducting wires need to be formed on the substrate of the chip package. However, as wiring density of the chip in the chip package increases and size of the chip decreases, design of the ground conducting wires become more difficult. In order to resolve the problem discovered by the inventor, the inventor provides a solution as a method as described in following description.

FIGS. 1A-1E are cross-sectional views showing the steps of forming a chip package according to an embodiment of the present invention. As shown in FIG. 1A, a substrate 100 is provided, which has a surface 100a and a surface 100b. The substrate 100 is, for example, a semiconductor substrate such as (but is not limited to) a silicon substrate. The substrate 100 may also be an insulating substrate such as (but is not limited to) a ceramic substrate. In one embodiment, the substrate 100 may be, for example, a semiconductor wafer (such as a silicon wafer) such that a wafer-level packaging process may be performed to reduce fabrication time and cost.

In one embodiment, a device region 102, a signal pad 104S, and a ground pad 104E may be disposed in or on the substrate 100. For example, in the embodiment shown in FIG. 1A, the device region 102, the signal pad 104S, and the ground pad 104E are disposed in the substrate 100 and exposed at the surface 100a of the substrate 100. The device region 102 may be formed with (but is not limited to) an optoelectronic device which may include an image sensor device or a light emitting device. The image sensor device is, for example, a CMOS image sensor (CIS) device or a charge-coupled device (CCD), and the light emitting device is, for example, a light emitting diode device. The signal pad 104S is electrically connected to the device region 102, which is used to transmit electrical signals into and/or from the device region 102. The ground pad 104E is used to lead out electrostatic discharge current. In one embodiment, the substrate 100 is a silicon wafer, wherein a plurality of device regions 102, signal pads 104S, and ground pads 104E are formed therein or thereon.

Although only a signal layered conducting pad (104S, 104E) is shown in FIG. 1A, a plurality of conducting pads may be stacked with each other and/or arranged on the substrate 100. For example, in one embodiment, the conducting pad (104S, 104E) is a stacked structure of a plurality of pads, at least a conducting pad, or a conducting pad structure including at least a conducting pad and at least an interconnection structure. In the following embodiments, for convenience, only a signal layered conducting pad (104S, 104E) is shown for simplicity.

As shown in FIG. 1A, a carrier substrate 106 may be optionally disposed on the substrate 100. For example, a spacer layer 105 is first formed on the surface 100a of the substrate, followed by disposing of the carrier substrate 106 on the spacer layer 105. The carrier substrate 106 may be, for example, a transparent substrate such as a glass substrate, quartz substrate, or the like. In one embodiment, the carrier substrate 106 may be used as a support, and a thinning process may be performed on the surface 100b of the substrate 100 to thin down the substrate 100 to a predetermined thickness for facilitating subsequent processes.

Figure 1B:
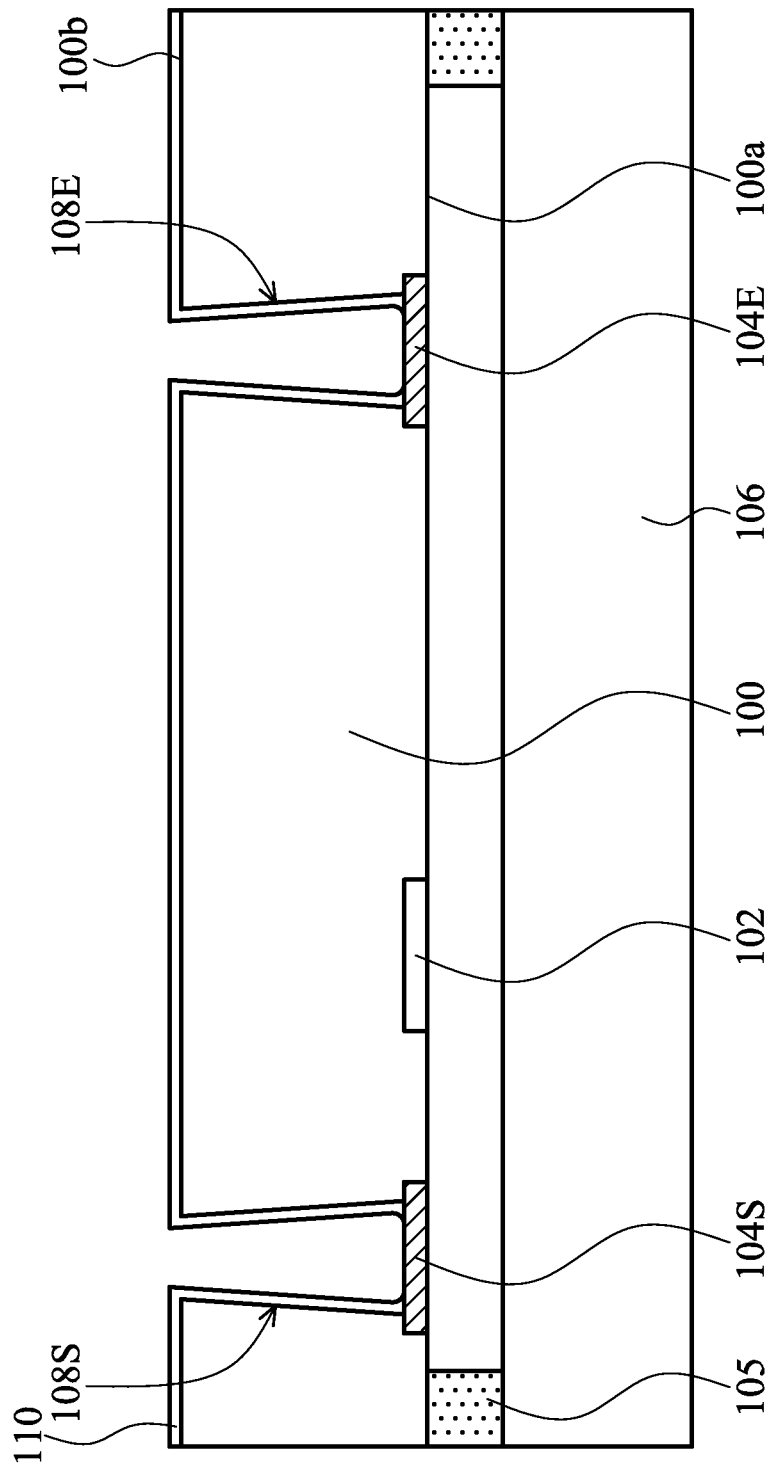

Then, a signal conducting layer electrically connected to the signal pad 104S and a ground conducting layer electrically connected to the ground pad 104E are formed on the substrate 100. As shown in FIG. 1B, in one embodiment, a portion of the substrate 100 may be optionally removed from the surface 100b of the substrate 100 to form a hole 108S which extends towards the signal pad 104S and exposes the signal pad 104S. In one embodiment, a portion of the substrate 100 may also be optionally removed from the surface 100b of the substrate 100 to form a hole 108E extending towards the ground pad 104E and exposing the ground pad 104E. In the embodiment where the substrate 100 is a conductive substrate (such as a silicon wafer), an insulating layer needs to be formed on the substrate 100. As shown in FIG. 1B, the insulating layer 110 extends from the surface 100b of the substrate 100 into the hole 108S and the hole 108E. In one embodiment, an etching process may be performed to remove the insulating layer 110 on the bottoms of the hole 108S and the hole 108E such that the signal pad 104S and the ground pad 104E are exposed, respectively.

Figure 1C:
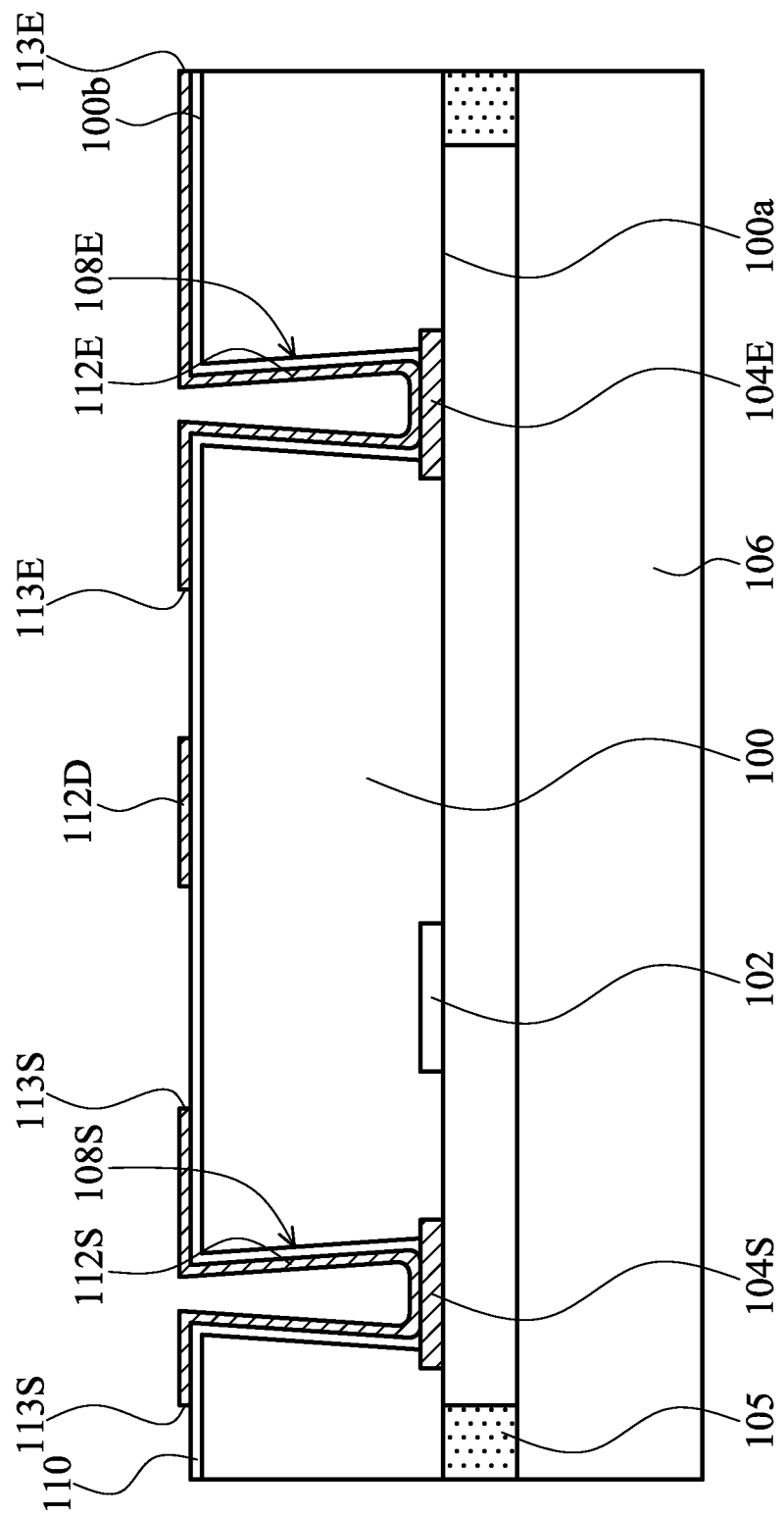

Next, a signal conducting layer 112S electrically connected to the signal pad 104S and a ground conducting layer 112E electrically connected to the ground pad 104E are formed on the surface 100b of the substrate 100, as shown in FIG. 1C. In one embodiment, a conducting material layer may be formed on the surface 100b of the substrate 100, which may extend into the hole 108S and the hole 108E to electrically connect to the signal pad 104S and the ground pad 104E, respectively. Then, the conducting material layer may be patterned to simultaneously form the signal conducting layer 112S and the ground conducting layer 112E. In one embodiment, in the step of patterning the conducting material layer, a dummy conducting layer 112D may be optionally formed. In subsequent processes, a dumpy bump may be formed on the dummy conducting layer.

In one embodiment, a seed layer may be formed on the surface 100b of the substrate 100, and a mask layer is formed on the seed layer. Then, an electroplating process is performed on the seed layer to deposit a conducting material on the exposed seed layer. Then, the mask layer is exposed, and the seed layer previously covered by the mask layer is etched and removed such that the conducting material layer composed of the seed layer and the electroplated conducting material is patterned, thus forming the desired patterned conducting layer which includes, for example, the signal conducting layer 112S, the ground conducting layer 112E, and/or the dummy conducting layer 112D.

As shown in FIG. 1C, the signal conducting layer 112S has two side edges 113S, and the ground conducting layer 112E also has two side edges 113E. One of the side edges 113E of the ground conducting layer 112E is located near a predetermined scribe line of the substrate 100. After a subsequent dicing process is performed, the side edge 113E of the ground conducting layer 112E may be exposed at a side of the substrate 100 after being diced.

Figure 1D:
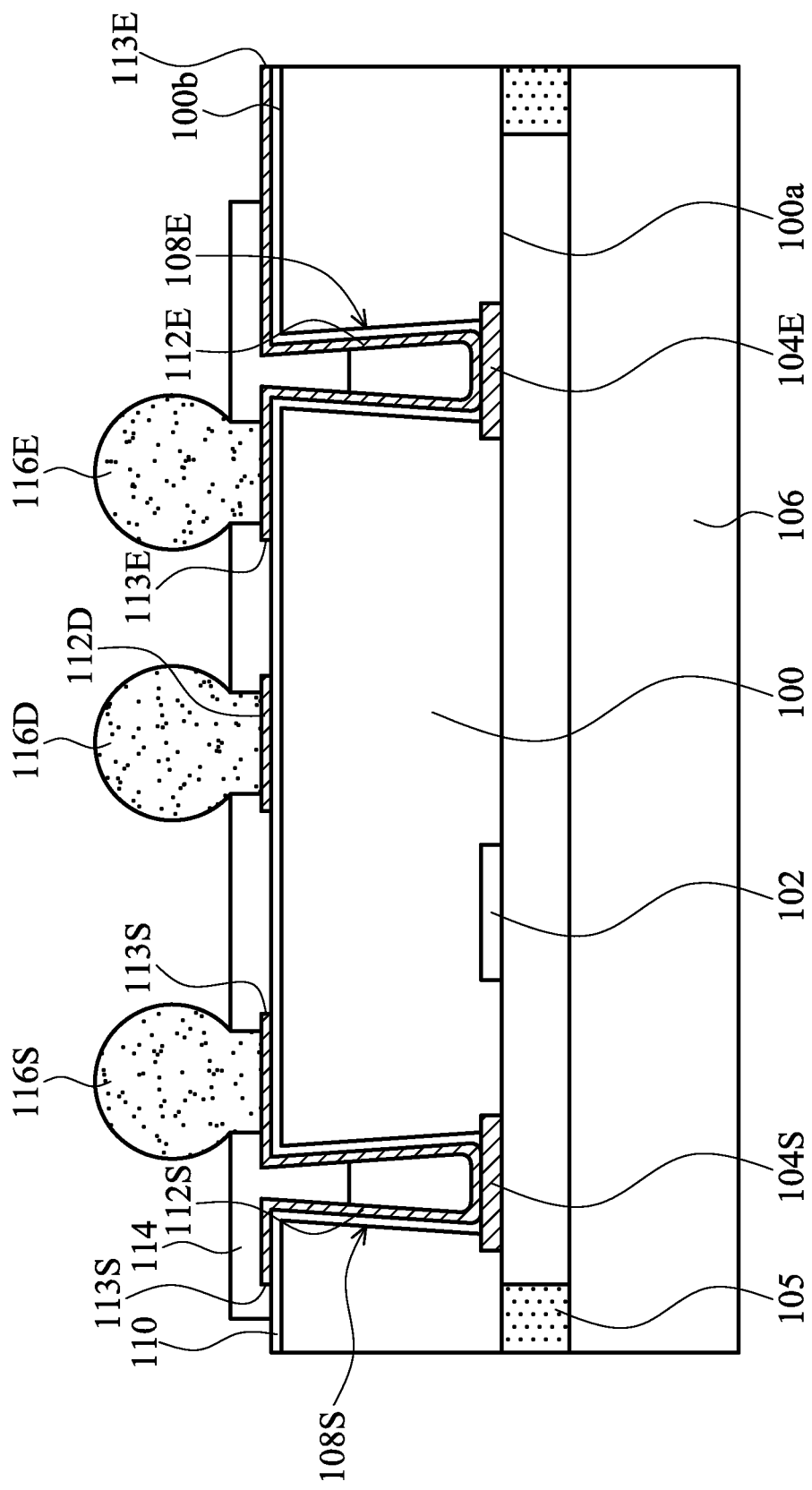

As shown in FIG. 1D, a protection layer 114 is formed on the surface 100b of the substrate 100. The protection layer 114 has at least an opening exposing a portion of the signal conducting layer 112S. The protection layer 114 may also have another opening which may expose, for example, a portion of the dummy conducting layer 112D and a portion of the ground conducting layer 112E. In one embodiment, the protection layer 114 covers the entire side edges 113E of the signal conducting layer 112E. The protection layer 114 only partially covers the side edges of the ground conducting layer 112E without covering the ground conducting layer 112E nearby the predetermined scribe line and without covering the side edge 113E of the ground conducting layer 112E near the predetermined scribe line.

Next, as shown in FIG. 1D, a signal bump 116S, a ground bump 116E, and a dummy bump 116D may be respectively formed on the signal conducting layer 112S, the ground conducting layer 112E, and the dummy conducting layer 112D exposed by openings of the protection layer 114. The dummy bump 116D may be used to balance stress suffered by each of the bumps on the substrate 100. In one embodiment, the ground bump 116E may also be used to balance stress suffered by each of the bumps on the substrate 100. In one embodiment, the dummy bump 116D and/or the dummy conducting layer 112D may not be formed. In one embodiment, the ground bump 116E may not be formed.

Next, the substrate 100 may be diced along predetermined scribe lines on the substrate to form at least one chip package, wherein the side edge 113E of the ground conducting layer 112E is exposed at a side of the substrate 100 after being diced. For example, in the embodiment shown in FIG. 1D, the exposed side edge 113E of the ground conducting layer 112E is substantially coplanar with the side of the substrate 100. The ground conducting layer 112E which is not covered by the protection layer 114 and exposed near the side of the substrate 100 may be used to electrically contact with another conducting structure such that electrostatic discharge current generated during the fabrication or the use of the chip package is led out, ensuring normal operation of the device region 102. In one embodiment, the dummy conducting layer 112D and the dummy bump 116D may also help to lead a portion of the electrostatic discharge current out.

Figure 1E:
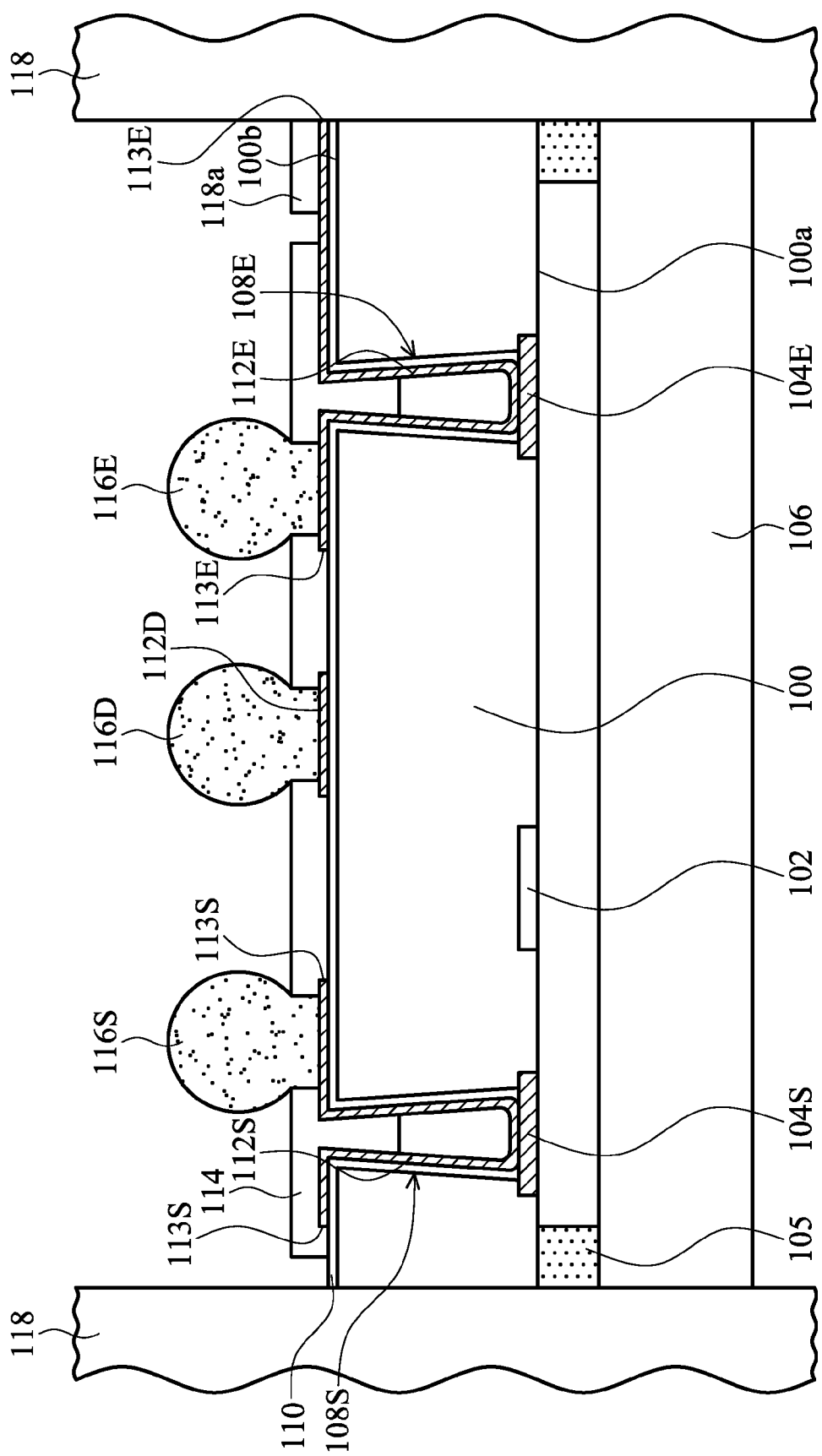

For example, as shown in FIG. 1E, a shell 118 may be used to cover the formed chip package. In one embodiment, the shell 118 may include a conducting portion 118a which is used to electrically contact with the exposed ground conducting layer 112E. Thus, electrostatic discharge current generated during the fabrication or the use of the chip package may be led out by the shell 118 including the conducting portion 118a.

Figure 2B:
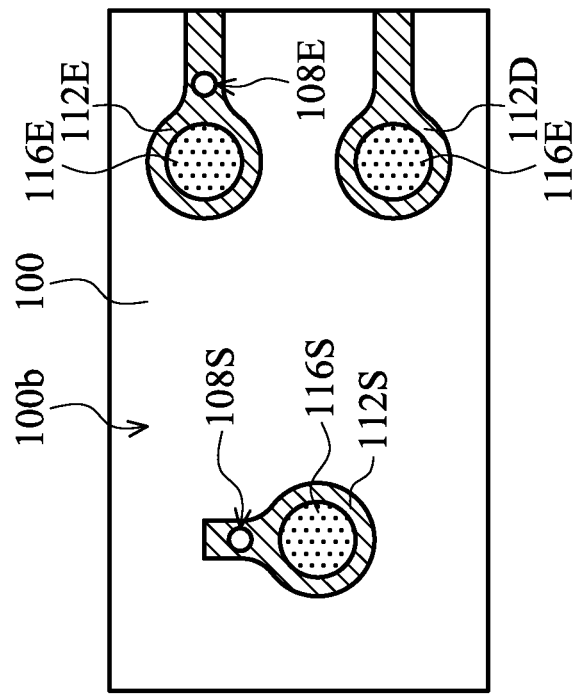
FIGS. 2A-2D are top views showing chip packages according to embodiments of the present invention.
Figure 2A:
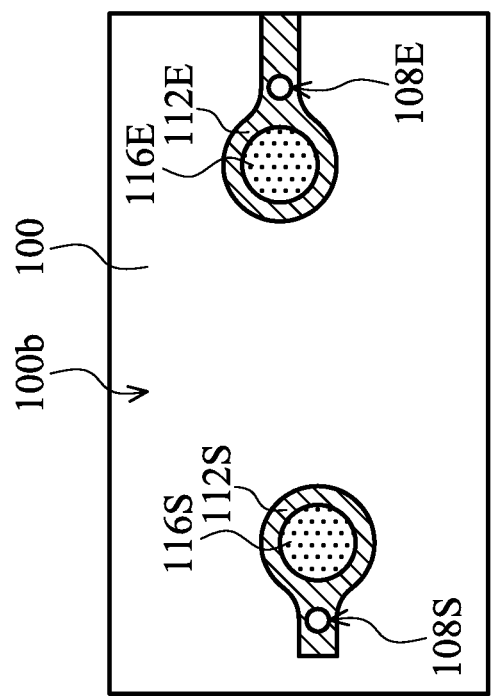

FIGS. 2A-2D are top views showing chip packages according to embodiments of the present invention, wherein same or similar reference numbers are used to designate same or similar elements, and the protection layer 114 is not shown for simplicity. As shown in FIG. 2A, in this embodiment, the ground conducting layer 112E is exposed at a side of the substrate 100, which may conveniently contact with another conducting structure. Thus, electrostatic discharge current generated during the fabrication or the use of the chip package may be led out through the ground pad and the ground conducting layer 112E in the hole 108E.

In the embodiment shown in FIG. 2B, a side edge of the dummy conducting layer 112D may also be exposed at a side of the substrate 100 (i.e., not covered by the protection layer 114), thus also helping to lead out electrostatic discharge current generated during the fabrication or the use of the chip package. In the embodiment shown in FIG. 2B, although both the side edges of the dummy conducting layer 112D and the ground conducting layer 112E are exposed at a same side of the substrate 100, embodiments of the invention are not limited thereto. In another embodiment, the side edges of the dummy conducting layer 112D and the ground conducting layer 112E may be exposed at different sides of the substrate 100, respectively.

Figure 2C:
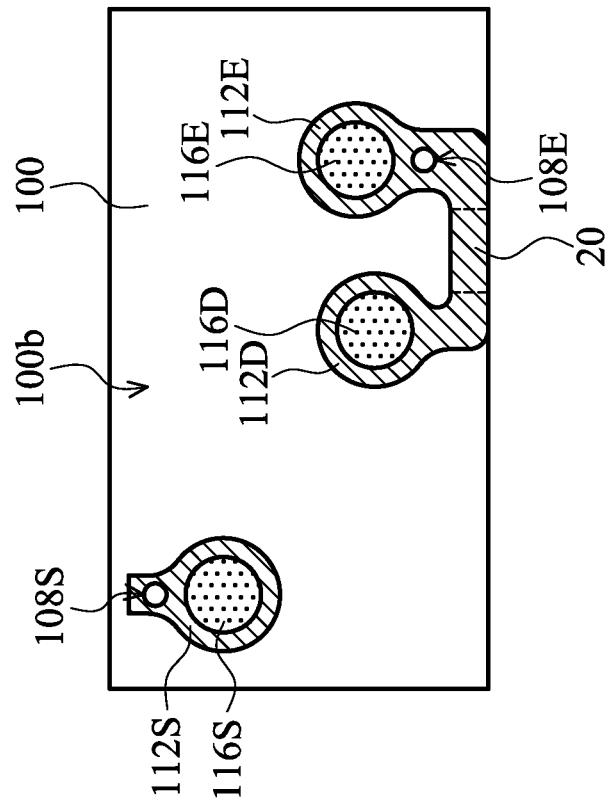

In the embodiment shown in FIG. 2C, at least a second ground conducting layer 112E2 and/or a second ground bump 116E2 disposed thereon may be further included. The second ground conducting layer 112E2 may also electrically contact with a second ground pad (not shown) through a hole 108E2, and a side edge of the second ground conducting layer 112E2 may also be exposed at a side of the substrate 100. In one embodiment, the second ground conducting layer 112E2 may be electrically connected to the ground conducting layer 112E through a conducting region 20.

Figure 2D:
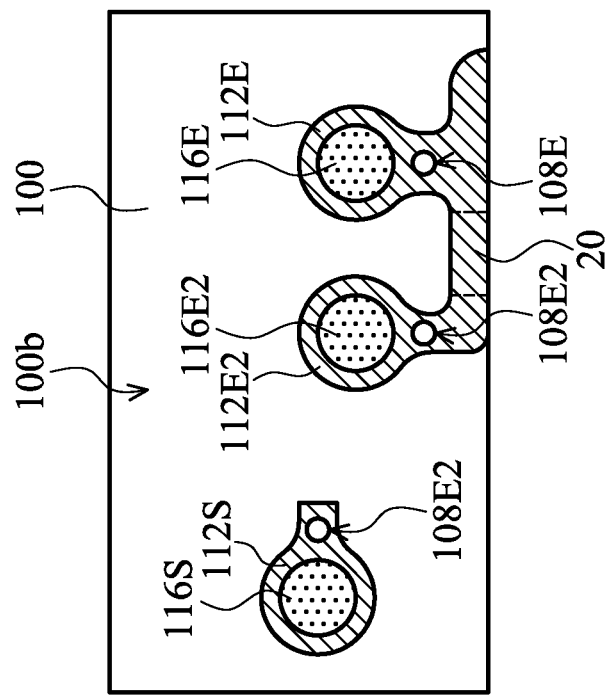

In the embodiment shown in FIG. 2D, a dummy conducting layer 112D may also be electrically connected to the ground conducting layer 112E through a conducting region 20.

The ground conducting structure of the chip package according to the embodiment of the invention is not limited to be located at corners of the substrate and can lead the electrical path to the side of the substrate to electrically connect to another conducting structure. Not only is the chip package protected, but wire density of the chip package is also reduced, improving performance and yield of the chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate;
   a device region disposed in or on the substrate;
   a signal pad disposed in or on the substrate and electrically connected to the device region;
   a ground pad disposed in or on the substrate;
   a signal bump disposed on a surface of the substrate, wherein the signal bump is electrically connected to the signal pad through a signal conducting layer;
   a ground conducting layer disposed on the surface of the substrate and electrically connected to the ground pad;
   a protection layer disposed on the surface of the substrate, wherein the protection layer completely covers entire side edges of the signal conducting layer and partially covers the ground conducting layer such that a side edge of the ground conducting layer is exposed at a side of the substrate;
   a dummy electrical connection structure disposed on the surface of the substrate; and
   a conducting layer electrically connected to the dummy electrical connection structure, wherein the protection layer partially covers the conducting layer such that a side edge of the conducting layer is exposed.

2. The chip package as claimed in claim 1, further comprising a ground bump disposed on the surface of the substrate, wherein the ground bump is electrically connected to the ground conducting layer.

3. The chip package as claimed in claim 1, wherein the exposed side edge of the ground conducting layer is substantially coplanar with the side of the substrate.

4. The chip package as claimed in claim 1, further comprising a hole extending from the surface of the substrate towards the signal pad and exposing a portion of the signal pad, wherein the signal conducting layer extends from the surface of the substrate into the hole and electrically contacts with the signal pad.

5. The chip package as claimed in claim 1, further comprising a second hole extending from the surface of the substrate towards the ground pad of the substrate and exposing a portion of the ground pad, wherein the ground conducting layer extends from the surface of the substrate into the second hole and electrically contacts with the ground pad.

6. The chip package as claimed in claim 1, wherein the conducting layer is electrically connected to the ground conducting layer.

7. The chip package as claimed in claim 1, wherein the side edge of the conducting layer is exposed at a second side of the substrate.

8. The chip package as claimed in claim 1, further comprising a second ground conducting layer disposed on the surface of the substrate, wherein the protection layer partially covers the second ground conducting layer such that a side edge of the second ground conducting layer is exposed at a side of the substrate, and the second ground conducting layer is electrically connected to the ground conducting layer.

9. The chip package as claimed in claim 1, further comprising a shell covering the substrate, wherein the shell comprises a conducting portion electrically contacting with the ground conducting layer.

10. The chip package as claimed in claim 1, wherein the dummy electrical connection structure comprises a dummy bump.

11. A method for forming a chip package, comprising:
providing a substrate, wherein a device region, a signal pad, and a ground pad are respectively disposed in or on the substrate, and the signal pad is electrically connected to the device region;
forming a signal conducting layer and a ground conducting layer on a surface of the substrate, wherein the signal conducting layer is electrically connected to the signal pad;
forming a protection layer on the surface of the substrate, wherein the protection layer exposes a portion of the signal conducting layer and completely covers the entire side edges of the signal conducting layer, wherein a side edge of the ground conducting layer is exposed;
forming a signal bump on the opening of the protection layer, wherein the signal bump is electrically connected to the signal pad through the signal conducting layer;
disposing a dummy electrical connection structure on the surface of the substrate;
forming a conducting layer on the substrate, wherein the conducting layer is electrically connected to the dummy electrical connection structure, and the protection layer partially covers the conducting layer such that a side edge of the conducting layer is exposed; and
dicing the substrate to form at least one chip package, wherein the side edge of the ground conducting layer is exposed at a side of the substrate after the substrate is diced.

12. The method for forming a chip package as claimed in claim 11, further comprising:
forming a second opening in the protection layer to expose a portion of the ground conducting layer; and
forming a ground bump on the second opening.

13. The method for forming a chip package as claimed in claim 11, wherein after the step of dicing the substrate is performed, the exposed side edge of the ground conducting layer is substantially coplanar with a side of the substrate.

14. The method for forming a chip package as claimed in claim 11, further comprising:
before the signal conducting layer is formed, removing a portion of the substrate from a second surface of the substrate to form a hole extending towards the signal pad, wherein the hole exposes the signal pad;
forming a conducting material layer on the surface of the substrate, wherein the conducting material layer extends into the hole to electrically contact with the signal pad; and
patterning the conducting material layer to form the signal conducting layer.

15. The method for forming a chip package as claimed in claim 11, further comprising:
before the ground conducting layer is formed, removing a portion of the substrate from a second surface of the substrate to form a second hole extending towards the ground pad, wherein the second hole exposes the ground pad;
forming a conducting material layer on the surface of the substrate, wherein the conducting material layer extends into the second hole to electrically contact with the ground pad; and
patterning the conducting material layer to form the ground conducting layer.

16. The method for forming a chip package as claimed in claim 11, wherein the formation steps of forming the signal conducting layer and the ground conducting layer comprise:
forming a conducting material layer on the surface of the substrate; and
patterning the conducting material layer to simultaneously form the signal conducting layer and the ground conducting layer.

17. The method for forming a chip package as claimed in claim 11, wherein the conducting layer is electrically connected to the ground conducting layer.

18. The method for forming a chip package as claimed in claim 11, wherein the signal conducting layer, the ground conducting layer, and the conducting layer are patterned from a same conducting material layer.

19. The method for forming a chip package as claimed in claim 11, further comprising covering the at least one chip package by a shell, wherein the shell comprises a conducting portion electrically contacting with the ground conducting layer.

20. The method for forming a chip package as claimed in claim 11, wherein the dummy electrical connection structure comprises a dummy bump.

* * * * *